(12) United States Patent
Zhu et al.

(10) Patent No.: US 7,785,944 B2
(45) Date of Patent: Aug. 31, 2010

(54) METHOD OF MAKING DOUBLE-GATED SELF-ALIGNED FINFET HAVING GATES OF DIFFERENT LENGTHS

(75) Inventors: Huilong Zhu, Poughkeepsie, NY (US); Bruce B. Doris, Brewster, NY (US); Xinlin Wang, Poughkeepsie, NY (US); Jochen Beintner, Wappingers Falls, NY (US); Ying Zhang, Yorktown Heights, NY (US); Philip J. Oldiges, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/077,973

(22) Filed: Mar. 24, 2008

(65) Prior Publication Data

US 2008/0176365 A1    Jul. 24, 2008

Related U.S. Application Data

(62) Division of application No. 10/711,182, filed on Aug. 31, 2004, now Pat. No. 7,348,641.

(51) Int. Cl.
    *H01L 21/84*    (2006.01)
(52) U.S. Cl. .................. 438/157; 438/478; 438/479; 438/481; 438/299; 438/176; 257/E21.415; 257/E21.255; 257/E21.703
(58) Field of Classification Search .................. 438/157, 438/31, 299, 500, 268, 270, 479, 478, 481, 438/176; 257/E21.415, E21.255, E21.703
See application file for complete search history.

(56) References Cited

U.S. PATENT DOCUMENTS

| | | | |
|---|---|---|---|
| 6,300,182 B1 | 10/2001 | Yu | |
| 6,403,434 B1 | 6/2002 | Yu | |
| 6,413,802 B1 | 7/2002 | Hu et al. | |
| 6,433,609 B1 | 8/2002 | Voldman | |
| 6,451,656 B1 | 9/2002 | Yu et al. | |
| 6,475,869 B1 | 11/2002 | Yu | |
| 6,475,890 B1 | 11/2002 | Yu | |
| 6,492,212 B1 | 12/2002 | Ieong et al. | |
| 6,521,502 B1 | 2/2003 | Yu | |
| 6,525,403 B2 | 2/2003 | Inaba et al. | |

(Continued)

*Primary Examiner*—William M Brewster
*Assistant Examiner*—Wilner Jean Baptiste
(74) *Attorney, Agent, or Firm*—H. Daniel Schnurmann; Daryl K. Neff

(57) ABSTRACT

A method is provided of making a gated semiconductor device. Such method can include patterning a single-crystal semiconductor region of a substrate to extend in a lateral direction parallel to a major surface of a substrate and to extend in a direction at least substantially vertical and at least substantially perpendicular to the major surface, the semiconductor region having a first side and a second side opposite, e.g., remote from the first side. A first gate may be formed overlying the first side, the first gate having a first gate length in the lateral direction. A second gate may be formed overlying the second side, the second gate having a second gate length in the lateral direction which is different from the first gate length. In one embodiment, the second gate length may be shorter than the first gate length. In one embodiment, the first gate may consist essentially of polycrystalline silicon germanium and the second gate may consist essentially of polysilicon.

16 Claims, 8 Drawing Sheets

U.S. PATENT DOCUMENTS

| | | |
|---|---|---|
| 6,562,665 B1 | 5/2003 | Yu |
| 6,580,137 B2 | 6/2003 | Parke |
| 6,583,469 B1 | 6/2003 | Fried et al. |
| 6,596,597 B2 * | 7/2003 | Furukawa et al. ........... 438/299 |
| 6,605,514 B1 | 8/2003 | Tabery et al. |
| 6,610,576 B2 | 8/2003 | Nowak |
| 6,611,029 B1 | 8/2003 | Ahmed et al. |
| 6,787,402 B1 | 9/2004 | Yu |
| 6,787,864 B2 * | 9/2004 | Paton et al. ................ 257/412 |
| 7,498,243 B2 * | 3/2009 | Liu et al. .................... 438/479 |
| 2002/0155685 A1 * | 10/2002 | Sakakibara ................. 438/500 |
| 2003/0102497 A1 * | 6/2003 | Fried et al. .................. 257/255 |
| 2004/0161898 A1 | 8/2004 | Fried et al. |
| 2005/0110078 A1 | 5/2005 | Shino |
| 2005/0110085 A1 | 5/2005 | Zhu et al. |
| 2005/0224890 A1 | 10/2005 | Bernstein et al. |
| 2005/0275040 A1 | 12/2005 | Anderson et al. |
| 2006/0043616 A1 | 3/2006 | Anderson et al. |

* cited by examiner

METHOD OF MAKING DOUBLE-GATED SELF-ALIGNED FINFET HAVING GATES OF DIFFERENT LENGTHS

CROSS-REFERENCE TO RELATED APPLICATION

This application is a divisional of U.S. application Ser. No. 10/711,182 filed Aug. 31, 2004 now U.S. Pat. No. 7,348,641 entitled "STRUCTURE AND METHOD OF MAKING DOUBLE-GATED SELF-ALIGNED FINFET HAVING GATES OF DIFFERENT LENGTHS", the disclosure of which is hereby incorporated by reference herein.

BACKGROUND OF THE INVENTION

The present invention relates to semiconductor devices and their manufacture, and more specifically to a structure and method of making a field effect transistor (FET) of the finFET type having dual gates.

Field effect transistors (FETs) can be formed in a variety of ways to serve a variety of purposes for integrated circuits and other devices. Commonly, FETs are formed as "planar" devices in many integrated circuits, i.e., as devices in which the conduction channel has width and length extending in a direction parallel to the major surface of a substrate. FETs can be formed in a semiconductor-on-insulator (SOI) layer of a substrate or in a bulk semiconductor substrate. Frequently, FETs are formed having a non-planar conduction channel, in order to serve a special purpose. In such non-planar FETs, either the length or the width of the transistor channel is oriented in the vertical direction, that is, in a direction perpendicular to the major surface of the substrate. In one such type of device, called the finFET, the width of the conduction channel is oriented in the vertical direction, while the length of the channel is oriented parallel to the major surface of the substrate. With such orientation of the channel, finFETs can be constructed to have a larger width conduction channel than planar FETs so as to produce larger current drive than planar FETs which occupy the same amount of integrated circuit area (the area parallel to the major surface of the substrate). Hence, it is desirable to incorporate finFETs in some types of integrated circuits where large current drive is needed and compactness of the device is important.

However, the fabrication of finFETs poses challenges. To improve mobility in the channel and enhance performance, FinFETs have lower doping levels than typical semiconductor-on-insulator (SOI) devices, and have lower doping levels than typical devices formed in bulk substrates (hereinafter, "bulk devices"). This makes the threshold voltage of the finFET difficult to control. In some finFETs, this problem is addressed by providing two independently controlled gates for the finFET, one primary gate which controls the normal switching and/or amplification function of the transistor, and another gate known as a "back gate," or "weak gate" which is used to adjust the threshold voltage of the finFET. Unfortunately, the additional gate is not without cost to the operation of the finFET. The back gate increases the capacitance of the finFET. Ultimately, the increase capacitance negatively affects the maximum switching speed and/or peak operating frequency of the transistor.

Accordingly, there is a need to provide an improved structure and method of making a dual gate finFET having a back gate for adjusting the threshold voltage of the finFET, while adding less capacitance to the device.

SUMMARY OF THE INVENTION

According to an aspect of the invention, a gated semiconductor device is provided, having a fin-shaped body which has a first dimension extending in a lateral direction parallel to a major surface of a substrate, and a second dimension extending in a direction at least substantially vertical and at least substantially perpendicular to the major surface, the body having a first side and a second side opposite the first side. The gated semiconductor device includes a first gate overlying the first side, and having a first gate length in the lateral direction. The gated semiconductor device further includes a second gate overlying the second side, the second gate having a second gate length in the lateral direction which is different from, and preferably shorter than the first gate length, the first gate being electrically isolated from the second gate.

According to another aspect of the invention, a gated semiconductor device is provided having a fin-shaped body which has a first dimension extending in a lateral direction parallel to a major surface of a substrate, and a second dimension extending in a direction at least substantially vertical and at least substantially perpendicular to the major surface, the body having a first side and a second side opposite the first side. The gated semiconductor device includes a first gate consisting essentially of polycrystalline silicon germanium overlying the first side, and having a first gate length in the lateral direction. The gated semiconductor device further includes a second gate consisting essentially of polysilicon overlying the second side, the second gate having a second gate length in the lateral direction which is different from, and preferably shorter than the first gate length.

According to another aspect of the invention, a method is provided of making a gated semiconductor device. Such method can include patterning a single-crystal semiconductor region of a substrate to extend in a lateral direction parallel to a major surface of a substrate and to extend in a direction at least substantially vertical and at least substantially perpendicular to the major surface, the semiconductor region having a first side and a second side opposite, e.g., remote from the first side. A first gate may be formed overlying the first side, the first gate having a first gate length in the lateral direction. A second gate may be formed overlying the second side, the second gate having a second gate length in the lateral direction which is different from the first gate length. In one embodiment, the second gate length may be shorter than the first gate length. In one embodiment, the first gate may consist essentially of polycrystalline silicon germanium and the second gate may consist essentially of polysilicon.

DETAILED DESCRIPTION

Figure 1:
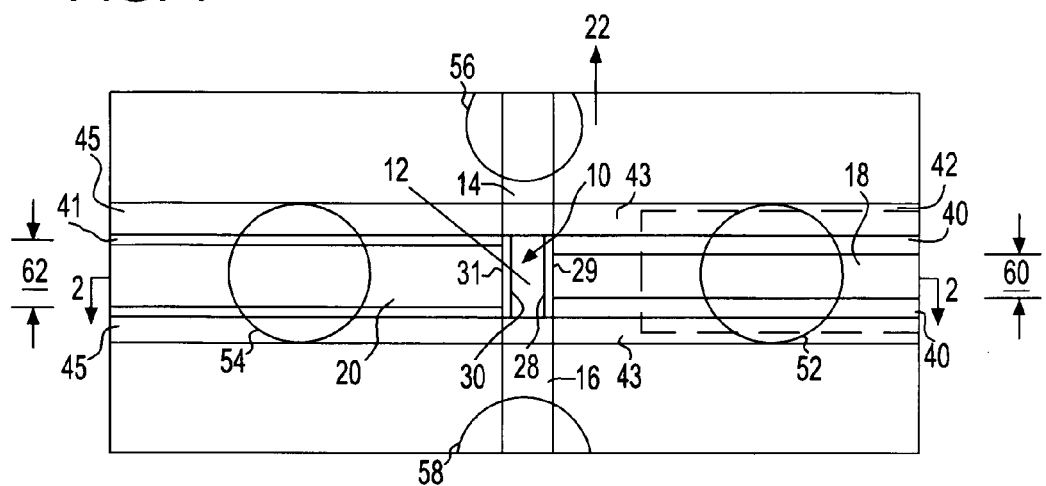
FIGS. 1 and 2 are a plan view, and cross-sectional view, respectively, illustrating the structure of a gated semiconductor device, such as a finFET, according to an embodiment of the invention.
Figure 2:
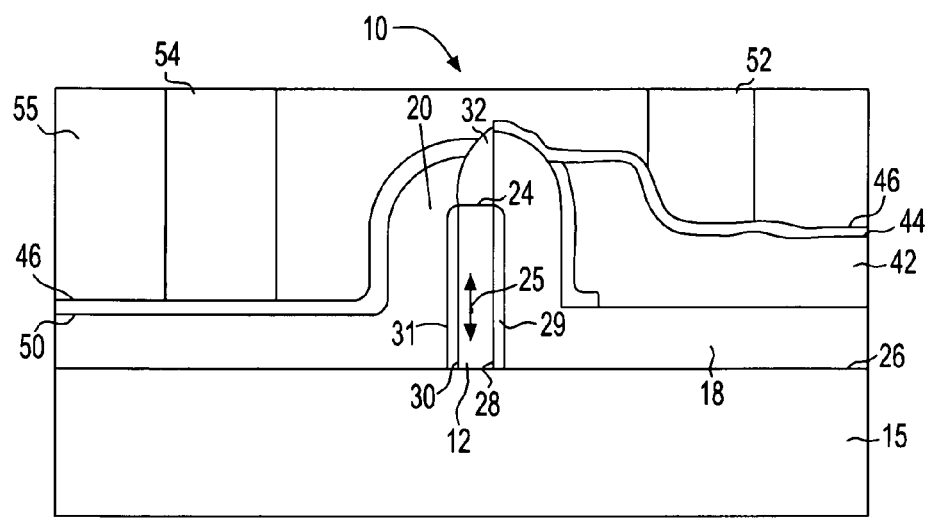
Figure 4:
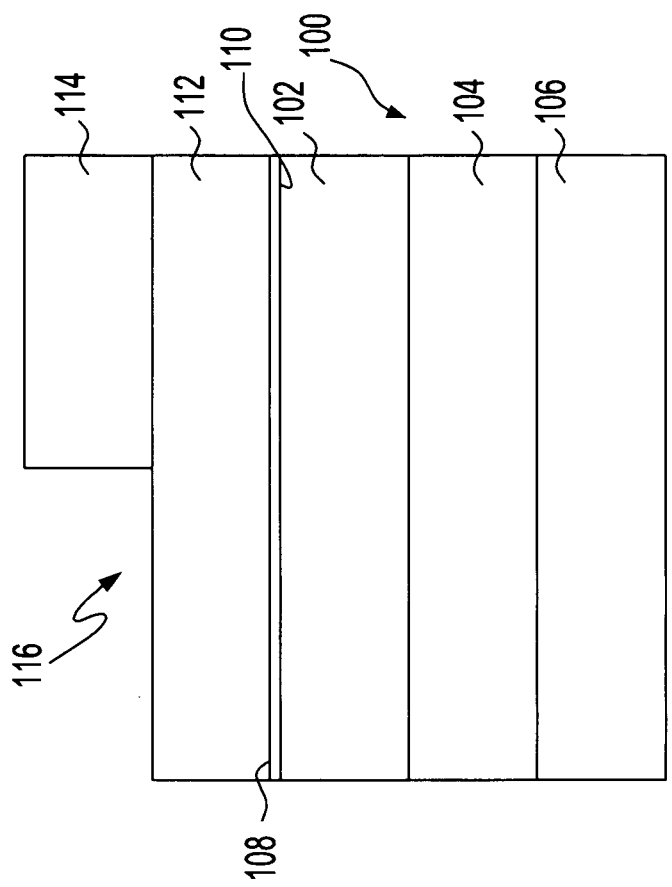
FIGS. 4 through 16 are cross-sectional views illustrating stages in the fabrication of a gated semiconductor device according to an embodiment of the invention.

FIGS. 1 and 2 are a plan view and a corresponding cross-sectional view, respectively, illustrating the structure of a gated semiconductor device 10 according to an embodiment of the invention. In one arrangement for use in an integrated circuit, the gated semiconductor device is operable as an insulated gate field effect transistor (FET) having a fin-shaped body 12, a source 14 disposed at one end of the body, and a drain 16 disposed at the other end of the body 12. In such arrangement, the gated semiconductor device 10 can be referred to as a finFET. Alternatively, in another arrangement in which one of the source and the drain is conductively connected to the gate of the transistor, the gated semiconductor device is operable as a gated diode device. With specific reference to FIG. 2, the body 12 is preferably disposed in a SOI layer overlying a buried oxide region 15 of an SOI substrate, the buried oxide region having an upper surface 26. The body 12 of the device 10 extends in a direction 22 (FIG. 1) which is parallel to the upper surface 26 of the BOX layer. The upper surface 26 of the BOX layer lies in a plane which is generally parallel to the major surface of the substrate. The body 12 of the device 10, which extends in a direction parallel to the upper surface of the BOX layer, thus extends in the lateral direction 22 which is parallel to the major surface of the substrate. The body 12 also extends in a direction 25 which is at least substantially vertical and at least substantially perpendicular to the upper surface of the BOX layer 26, i.e., in a direction at least substantially perpendicular to the major surface of the substrate. The body 12 further has a first side 28 over which a first gate 18 is disposed and a second side 30 over which a second gate 20 is disposed. The first gate 18 has a first gate length 60 (FIG. 1) which is substantially different from the second gate length 62 (FIG. 1) of the second gate 20. In a preferred embodiment, the first gate length 60 is substantially shorter than the second gate length 62, i.e., by 10% or more of the second gate length 62, and more preferably by 20% to 60% of the second gate length. In a preferred embodiment, the first gate length and the second gate length are made very small. For example, the second gate length is nominally set to 25 nm, and the first gate length is set to 20 nm. The first gate 18 is insulated from the body 12 by a first gate dielectric 29 and the second gate 20 is insulated from the body 12 by a second gate dielectric 31. In common usage, when a double-gated semiconductor device is electrically connected for use as a transistor, one of the gates is used primarily for operating the transistor, and can be referred to as a "top gate" or "strong gate", while the other of the gates is used primarily for biasing the transistor to adjust the threshold voltage $V_T$ of the transistor and is referred to as a "bottom gate" or "weak gate". With respect to the gated semiconductor device 10 of the present embodiment, when the thicknesses of the first gate dielectric 29 and the second gate dielectric 31 are the same, the second gate 20 functions as the "strong gate" and the first gate 18 functions as the "weak gate".

Figure 3:
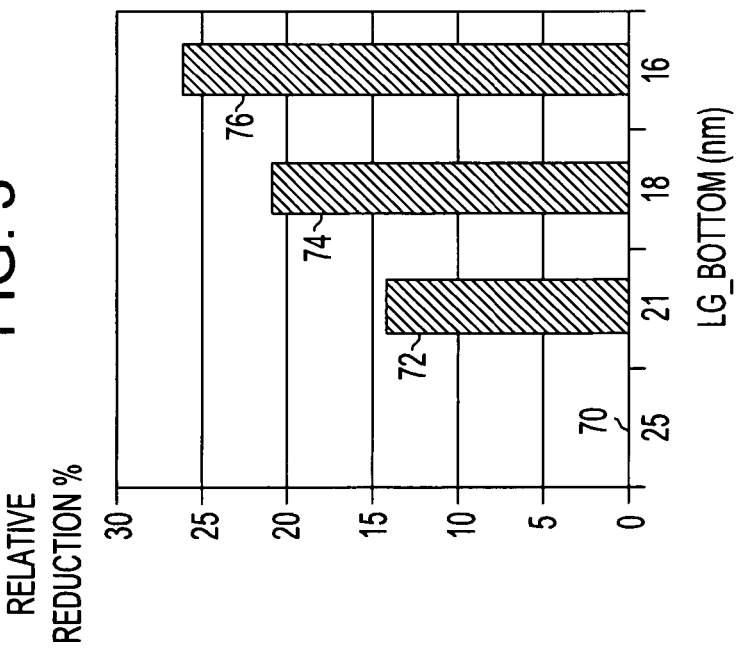
FIG. 3 is a graph illustrating relative reduction in capacitance of a weak gate of a double-gated semiconductor device, relative to a strong gate, for various relative reductions in the gate length of the weak gate.

An advantage of providing a weak gate having a shorter gate length than the strong gate of the device 10 is to reduce the gate capacitance due to the weak gate, thus reducing the impact of the weak gate on the performance of the device 10. Here, the gate length of the first gate (the weak gate) is reduced relative to the gate length of the second gate (the strong gate) to reduce unnecessary capacitance. FIG. 3 is a graph illustrating relative reductions in gate capacitance, obtained through computer simulation, for devices having different first gate lengths, which are shortened by different degrees relative to the second gate length. The data illustrated in FIG. 3 is for a device in which the length of the second gate (the strong gate) is 25 nm. As shown in FIG. 3, the left most "bar" 70 indicates the reduction in capacitance of the first gate (the weak gate) in relation to the second gate (the strong gate) when the first gate has a gate length of 25 nm. Since for that bar 70 the first gate length (25 nm) is the same as the second gate length (25 nm), there is no reduction in the gate capacitance of the first gate. As further shown at 72 in FIG. 3, when the first gate length is reduced to 21 nm, the gate capacitance due to the first gate is reduced by 13% relative to the gate capacitance due to the second gate. When the first gate length is reduced to 18 nm, as shown at 74, a still greater (21%) reduction in the gate capacitance due to the first gate is achieved. When the length of the first gate is reduced to 16 nm, as shown at 76, a 26% reduction in the gate capacitance due to the first gate is achieved.

Referring again to FIG. 2, the body has a top surface 24 over which an insulating cap 32 is disposed. As further shown in FIG. 1, the gated semiconductor device 10 also includes oxide regions 40 disposed along edges of the first gate 18, the oxide regions 40 having a composition including an oxide of silicon and an oxide of germanium. Dielectric spacers 43 are disposed laterally adjacent to the oxide regions 40, the dielectric spacers 43 preferably consisting essentially of a nitride, e.g., silicon nitride. A first polysilicon gate layer 42 is also disposed overlying the first gate, the first polysilicon gate layer preferably at least partly overlying each of the oxide regions 40 disposed to either side of the first gate 18. In addition, oxide regions 41 are disposed along edges of the second gate, the oxide regions 41 consisting essentially of an oxide of silicon. In addition, dielectric spacers 45 are disposed laterally adjacent to the oxide regions 41, the dielectric spacers 45 preferably consisting essentially of a nitride, e.g., silicon nitride. With reference to FIG. 2, in one embodiment, a silicide layer 46 is disposed on the upper surface 44 of the first polysilicon gate layer 42, the upper surface 50 of the second gate 20, and overlying each of the source and drain. Finally, an interlevel dielectric (ILD) 55 is provided over the silicide layer 46. A first conductive via 52 conductively contacts the silicide layer 46 overlying the first gate polysilicon layer, another conductive via 54 conductively contacts the silicide layer 46 overlying the second gate 20, and other conductive vias 56 and 58 conductively contact the silicide layer 46 overlying the source 14 (FIG. 1) and the drain 16 (FIG. 1).

A method of making a self-aligned double-gated semiconductor device according to an embodiment of the invention will now be described with additional reference to FIGS. 4 through 16. Preferably, the gated semiconductor device is fabricated in a single-crystal semiconductor-on-insulator ("SOI") layer 102 or a silicon-on-insulator layer of an SOI substrate 100 in which the SOI layer 102 is disposed overlying a buried oxide layer 104. The buried oxide layer 104, in turn, is disposed over a bulk semiconductor region 106 of the substrate. A thin oxide 108 is disposed on the top surface 110 of the SOI layer 102, such as that which is commonly used as a gate dielectric of other FETs being manufactured on the SOI layer 102. Here, thin oxide layer 108 functions as an etch stop layer in the fabrication of the gated semiconductor device 10 (FIGS. 1 and 2). A layer of polycrystalline silicon germanium ("poly-SiGe") 112 is thereafter formed over the thin oxide 108, after which a photoresist layer 114 is deposited and patterned to form an opening 116 over a portion of the SOI layer 102.

Figure 6:
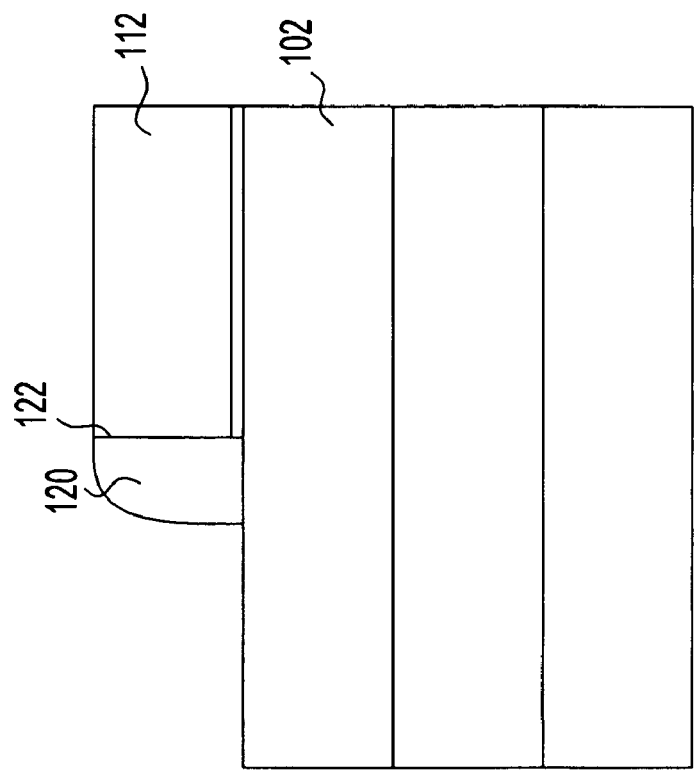
Figure 5:
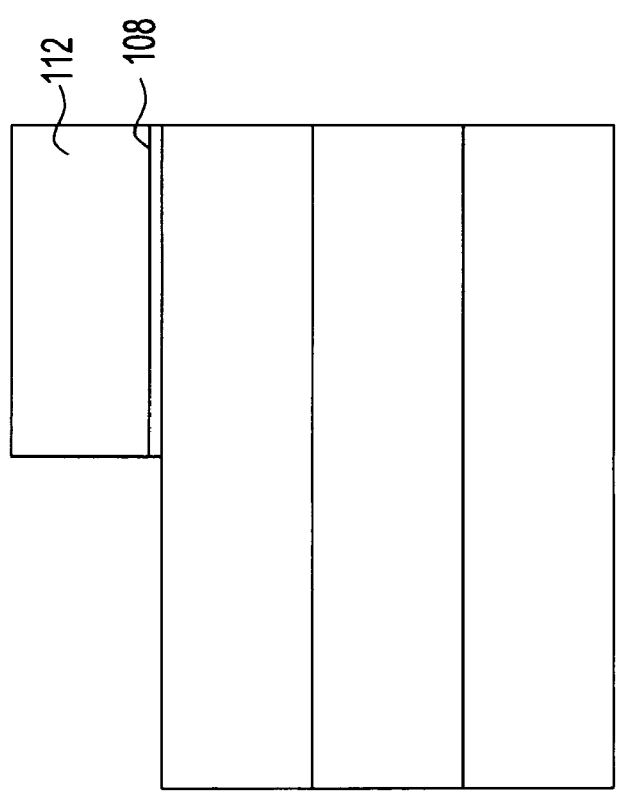

Thereafter, as shown in FIGS. 5 and 6, the patterned photoresist layer 114 is used as a mask to transfer the pattern to the poly-SiGe layer 112, as by a directional reactive ion etch ("RIE") that is first performed selective to the oxide in oxide layer 108, so as to stop etching when the oxide layer 108 is reached. Thereafter, the oxide layer 108 is removed as by etching for a short duration, e.g., through an isotropic etch with a reagent such as hydrofluoric acid ("HF"). Subsequent thereto, a sidewall spacer 120 is formed on a sidewall 122 of the poly-SiGe layer 112 through a well-known technique such as depositing a conformal layer of dielectric material, e.g., silicon nitride, over the poly-SiGe layer 112 and other layers, and then vertically etching the conformal layer, as by RIE, selective to the material, e.g., silicon, of the underlying SOI layer 102.

Figure 8:
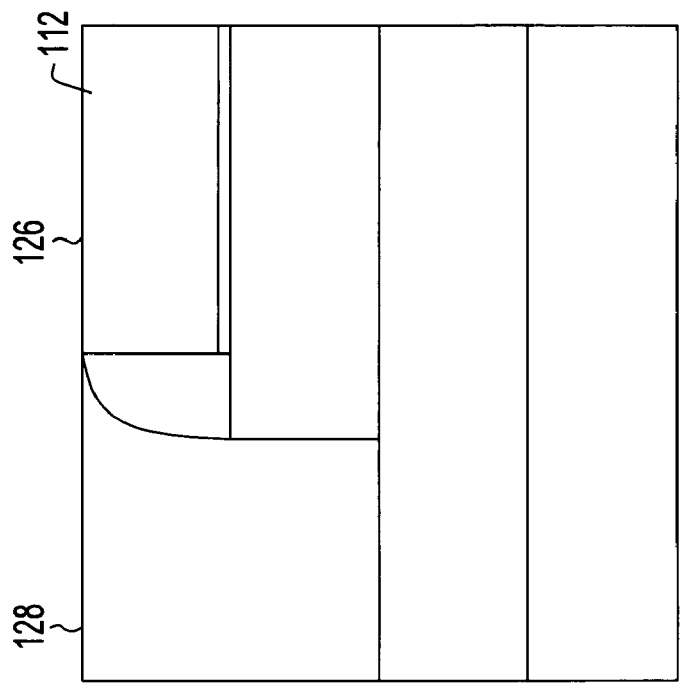
Figure 7:
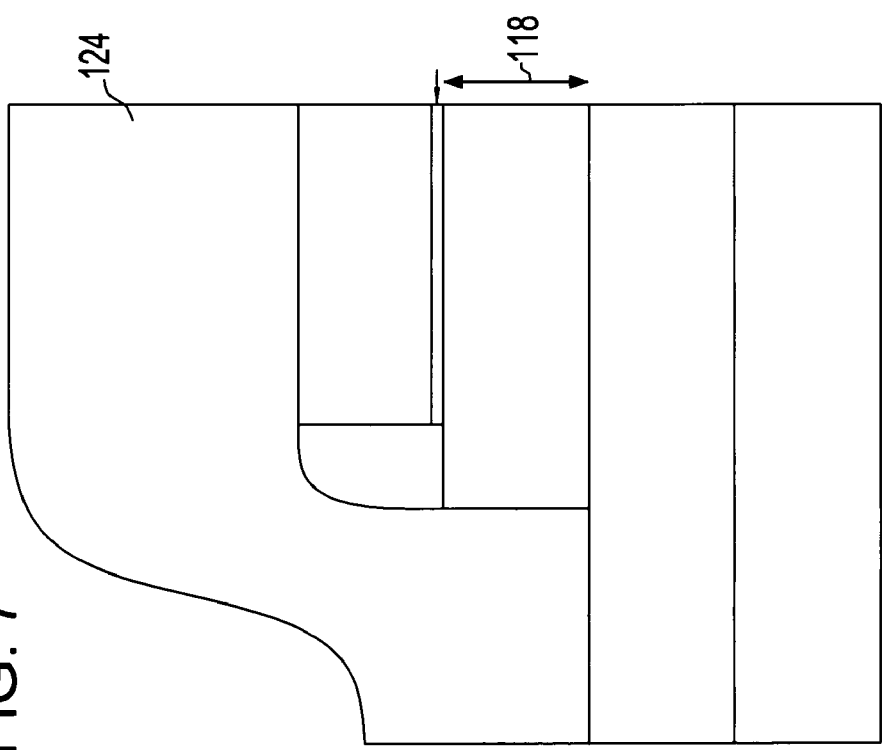

Subsequent thereto, as shown in FIG. 7, a thick layer 124 of oxide is deposited over the poly-SiGe layer. Thereafter, the oxide layer 124 is planarized as shown in FIG. 8, by, for example, performing chemical mechanical polishing ("CMP") selective to polycrystalline silicon germanium and selective to nitride, stopping on the top of the nitride spacer. This results in the structure as shown in FIG. 8 in which a top surface 128 of the oxide layer is planarized to a top surface 126 of the poly-SiGe layer 112.

Figure 9:
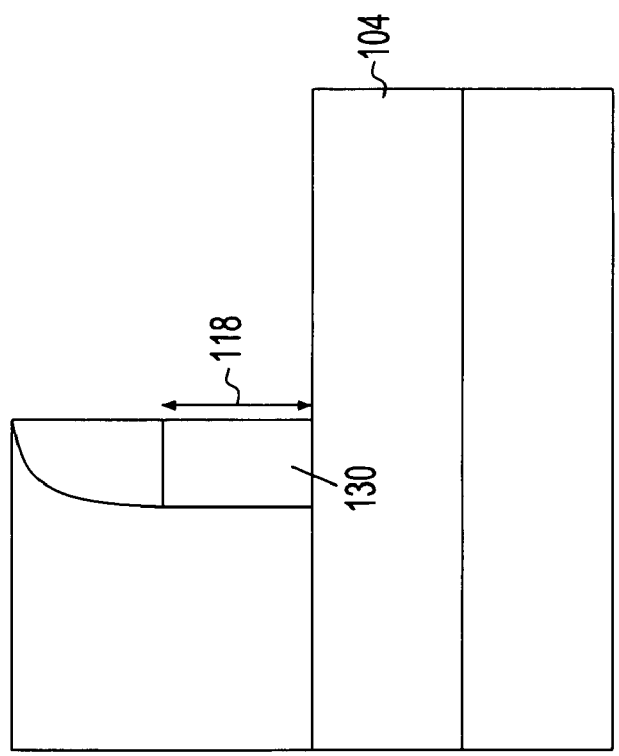

Thereafter, as shown in FIG. 9, the SOI layer is etched again, stopping on the BOX layer 104. This etch is preferably performed by RIE to etch through the poly-SiGe layer 112 (FIG. 8), thin oxide and SOI layer to produce a "fin" structure 130 from the poly-SiGe layer which overlies the BOX layer 104. In processing up to this point, the choice of polycrystalline silicon germanium is favored as the material of the layer 112 when the fin structure 130 is etched because it tends to etch at a faster rate than polysilicon or single-crystal silicon, when all other characteristics of the materials are considered to be equal. The faster etching rate of polycrystalline silicon germanium helps to fully remove that layer 112 when the fin structure 130 is patterned, while protecting the fin structure from erosion during that patterning. The resulting fin structure 130 has dimension 118 in the vertical direction which equates at least generally to a width of the conduction channel of the gated semiconductor device when completed. The patterning of the SOI layer is preferably performed by etching the SOI layer selective to the oxide of the underlying BOX layer 104 so as to stop on the BOX layer 104, as shown.

Figure 10:
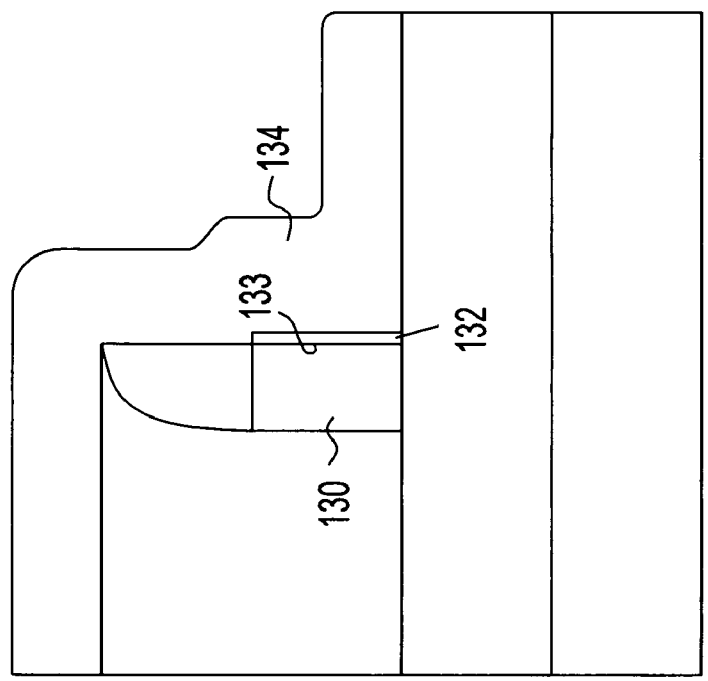

Thereafter, as shown in FIG. 10, a first gate dielectric 132 is formed on a sidewall 133 of the fin structure 130, after which a further layer of polycrystalline silicon germanium ("poly-SiGe") 134 is formed in a conformal deposition process. Illustratively, the thin dielectric 132 is formed by thermal oxidation and/or thermal nitridation and/or deposition of a high dielectric constant ("high-K") dielectric material. Thereafter, as shown in FIG. 11, a further layer of oxide 138 is deposited over the structure and then planarized to the top surface 128 of the pre-existing oxide layer 124, such as by a further chemical mechanical polishing (CMP) step.

Figure 11:
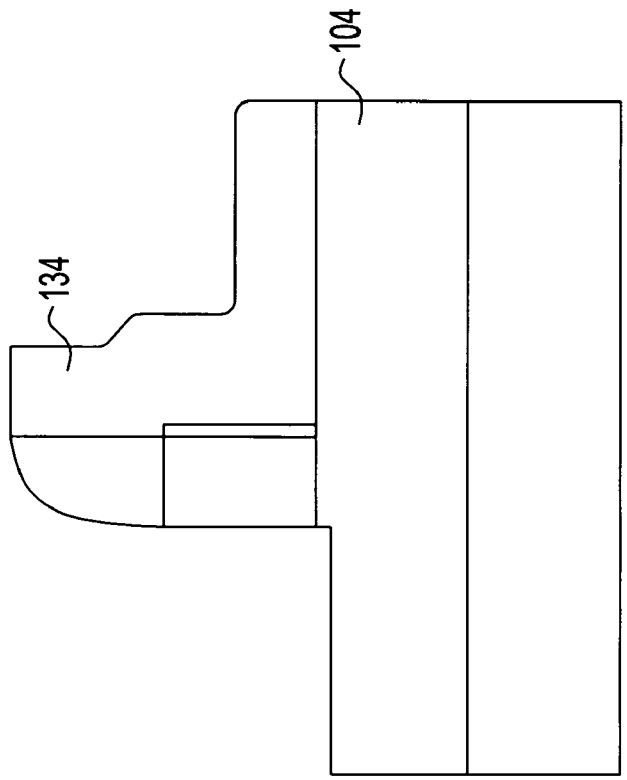
Figure 12:
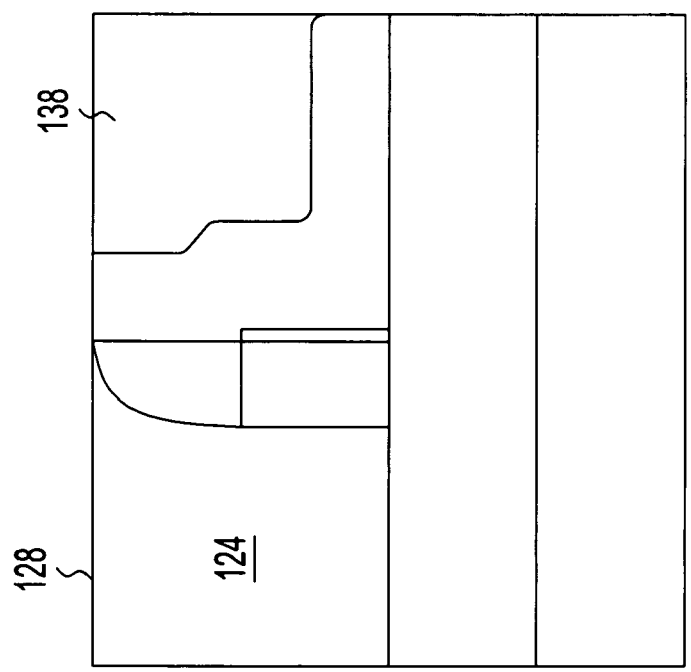

Thereafter, referring to FIG. 12, the oxide layers 124 and 138 shown in FIG. 11 are removed, as by a process of etching the oxide selective to the materials that are to remain after the etch, i.e., the poly-SiGe layer 134. Here, RIE or an isotropic etch selective to the poly-SiGe layer 134 is sufficient to remove the oxide layers 124, 138.

Figure 13:
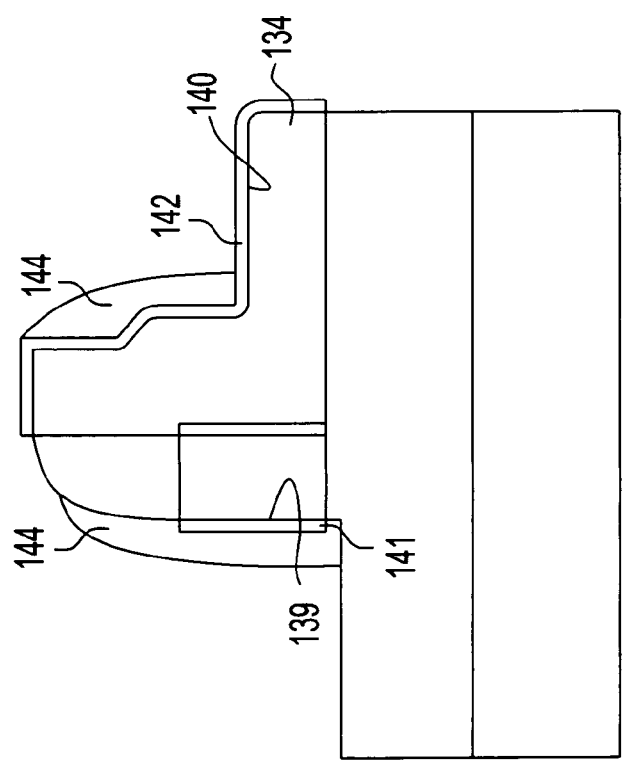

FIG. 13 shows a stage of processing subsequent to that shown in FIG. 12. At this stage, a gate dielectric 141 is formed on the second sidewall 139 of the fin structure. At the same time, a thin dielectric 142 is formed on the outer surface 140 of the poly-SiGe layer 134. Illustratively, the thin dielectric 142 is formed by thermal oxidation and/or thermal nitridation and/or deposition of a high dielectric constant ("high-K") dielectric material onto the top surface 140 of the poly-SiGe layer 134. Thereafter, relatively thin spacers 144 of polysilicon are formed on the vertical sidewalls of the structure. The polysilicon spacer 144 protects the gate dielectric 141 covering the second sidewall 139 of the fin structure 130 during the subsequent removal of the thin dielectric 142 from most of the outer surface 140 of the poly-SiGe layer 134.

Figure 14:
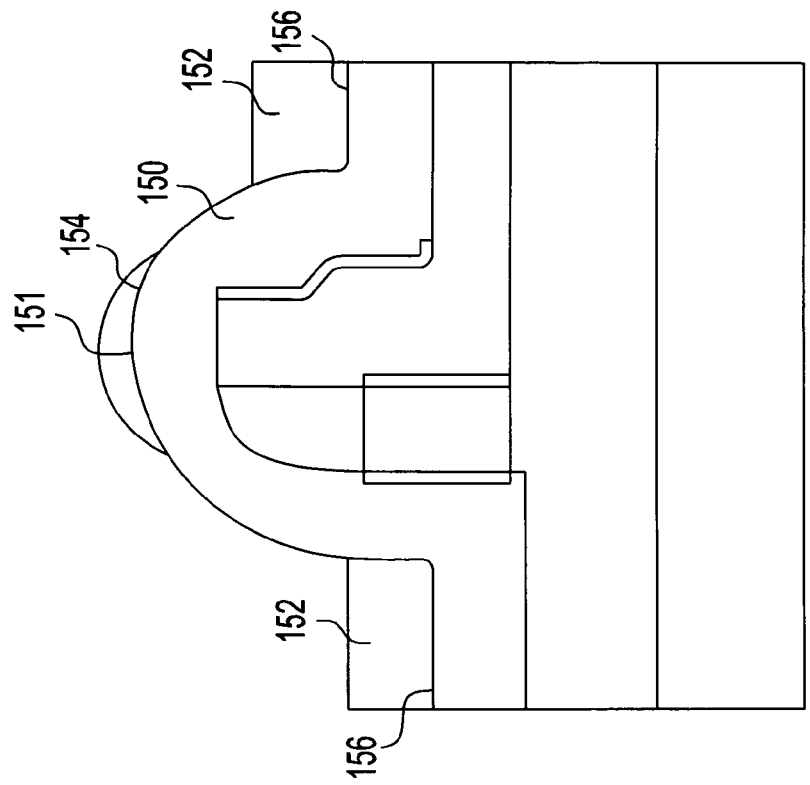

Later, as shown in FIG. 14, polysilicon is deposited conformally over the structure to form a layer 150, after which an oxide is deposited to cover the essentially horizontal surfaces 154, 156 of the polysilicon layer 150 through a directional deposition process such as high-density plasma (HDP) deposition. This results in a relatively thin layer 151 of oxide covering the uppermost horizontal surface 154 of the polysilicon layer 150, while forming thicker regions 152 covering the lower horizontal surfaces 156 of layer 150.

Figure 15:
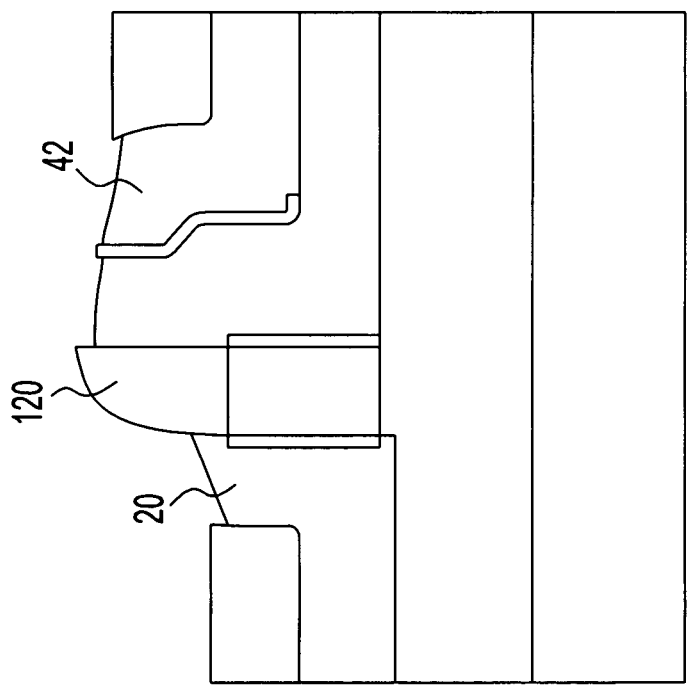

Thereafter, as shown in FIG. 15, the thin layer 151 of oxide (FIG. 14) is removed to expose the uppermost horizontal surface, after which the polysilicon layer 150 (FIG. 14) is then etched back, such that the nitride spacer 120 is exposed above the fin structure. These steps are preferably performed using an HF based oxide chemical etch to remove oxide layer 151, followed by a wet chemical etch of the polysilicon layer 150, to result in the separation of that layer into a first gate polysilicon layer 42 and the second gate 20. Alternatively, with reference to FIG. 14, another way to separate the first gate from the second gate is to deposit an oxide, and thereafter perform CMP, stopping on the top of the polysilicon layer 150 above the fin structure, and etching the exposed portion of the polysilicon layer 150 to separate the polysilicon layer into the first gate polysilicon layer 42 and the second gate 20 that are shown in FIG. 15. In still another alternative, the CMP process can be conducted to stop on the nitride spacer 120, followed by etching the exposed polysilicon layer to separate that layer into the first gate polysilicon 42 and the second gate 20.

Figure 16:
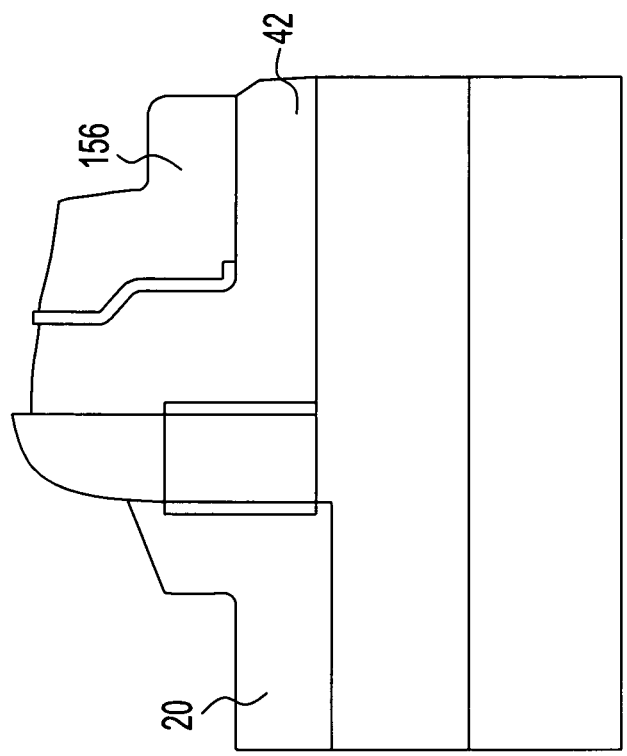

Thereafter, the oxide layer covering the first gate polysilicon 42 and the second gate 20 are removed, as by wet etching, to produce the structure shown in FIG. 16. Finally, with reference to FIGS. 1 and 2, steps are performed to complete the self-aligned gated semiconductor device 10. Such steps include the patterning of the first gate polysilicon layer 42 and the second gate 20 in the lateral direction 22 using one photolithographic mask, followed by oxidation of the sidewalls of the first gate 18 to form the spacers 40, and oxidation of the sidewalls of the second gate 20 to form the spacers 41 having a width different from the widths of spacers 40, as shown in FIG. 1. In this case, the first gate, i.e., the poly-SiGe gate has smaller gate length than the second gate, consisting essentially of polysilicon, due to the fact that poly-SiGe has a faster oxidation rate than does polysilicon. Accordingly, the oxidation process consumes more SiGe than Si under the same oxidation conditions. Thereafter, further spacers 43 and 45 are formed on sidewalls of the respective spacers 40 and 41. Ion implants are now performed to the source 14 and drain 16, as masked by the first and second gates, spacers 43, 45 and nitride cap 32. Thereafter, a silicide layer 46 is formed, preferably by a self-aligned technique, overlying and self-aligned to individual component portions of the first gate polysilicon layer 42, second gate 20, source 14 and drain 16, such that the silicide layer 46 overlying each component portion is insulated from each other portion. Finally, an interlevel dielectric 55 is formed over the structure and contact vias 52, 54, 56 and 58 are then etched and filled to conductively contact the silicide layer overlying each of the first gate polysilicon layer 42, second gate 20, source 14 and drain 16 to complete the gated semiconductor device 10.

While the invention has been described in accordance with certain preferred embodiments thereof, those skilled in the art will understand the many modifications and enhancements which can be made thereto without departing from the true scope and spirit of the invention, which is limited only by the claims appended below.

For example, in an alternative embodiment, the gated semiconductor device is fabricated in a single-crystal region of a bulk semiconductor substrate (not shown), and is fabricated by the same process as discussed above, except as referring to FIG. 7, a timed etch defines the width of the conduction channel, instead of the thickness 118 of the SOI layer defining the width of the conduction channel.

Moreover, referring to FIG. 2, it is not essential for the body 12 of the gated semiconductor device 10 to have a top side 24 and an insulating cap 32 overlying the top side 24. In an alternative embodiment, the first side 28 of the gated semiconductor device is connected directly to the second side 30, eliminating the top side 24. In such case, isolation between the first gate and the second is achieved by vertically displacing the first gate relative to the second gate and isolating the gates from each other by a dielectric isolation region covering the body 12 between the first gate and the second gate.

What is claimed is:

1. A method of making a gated semiconductor device, comprising:
   patterning a single-crystal semiconductor region of a substrate to extend in a lateral direction parallel to a major surface of a substrate and to extend in a direction at least substantially vertical and at least substantially perpendicular to the major surface, the semiconductor region having a first side defined by a first surface of the semiconductor region, the first surface extending in the vertical and lateral directions and a second side opposite the first side, the second side defined by a second surface of the semiconductor region, the second surface being remote from the first surface, and the second surface extending in the vertical and lateral directions;
   forming a first gate overlying the first side, the first gate overlying a first portion of the first side, the first portion having a first gate length in the lateral direction; and
   forming a second gate overlying the second side, the second gate overlying a second portion of the second side, the second portion having a second gate length in the lateral direction which is different from the first gate length, the second gate being electrically isolated from the first gate, wherein the first gate and the second gate are formed by:
   forming a first region consisting essentially of polycrystalline silicon germanium overlying the first side;
   thereafter forming a second region consisting essentially of polysilicon overlying the second side and insulated from the first region;
   simultaneously lithographically patterning the first region and the second region using a given opening of a given lithographic mask, and
   thereafter simultaneously thermally oxidizing the first region and the second region, the first region being oxidized faster than the second region so as to define the first gate length and the second gate length such that the first gate length is shorter than the second gate length.

2. The method as claimed in claim 1, wherein the first gate length is substantially shorter than the second gate length such that the first gate has lower gate capacitance relative to the body than the second gate.

3. The method as claimed in claim 1, wherein the first gate is formed to overlie a first gate dielectric and the second gate is formed to overlie a second gate dielectric spaced from the first gate dielectric by intermediate structure.

4. The method as claimed in claim 1, further comprising forming a first oxide region including at least one of an oxide of silicon or an oxide of germanium having an exposed major surface with a contour conforming to a major surface of the first gate.

5. The method as claimed in claim 4, further comprising forming a second oxide region including an oxide of silicon having an exposed major surface with a contour conforming to a major surface of the second gate.

6. The method as claimed in claim 5, further comprising forming a first spacer laterally adjacent to the first oxide region and forming a second spacer laterally adjacent to the second oxide region.

7. The method as claimed in claim 6, wherein the substrate includes a single-crystal semiconductor layer, a bulk single-crystal semiconductor region and a buried oxide ("BOX") layer separating the single-crystal semiconductor layer from the bulk semiconductor region, wherein the step of patterning the single-crystal semiconductor region forms a body in the single-crystal semiconductor layer.

8. The method as claimed in claim 7, wherein the first gate and the second gate contact the BOX layer of the substrate.

9. The method as claimed in claim 8, wherein the body includes a top surface extending between the first and second surfaces and the body is electrically insulated from the first gate and the second gate by the BOX layer, the first gate dielectric, the second gate dielectric and a dielectric cap overlying the top surface.

10. The method as claimed in claim 2, further comprising forming a source region and a drain region in the patterned single-crystal semiconductor region at positions separated by the first and second gates, wherein the body has predominantly a first dopant type selected from n-type and p-type and the source region and drain region both have predominantly a second dopant type selected from n-type and p-type, the second dopant type being different from the first dopant type.

11. The method as claimed in claim 10, further comprising conductively connecting the second gate to one of the source region and the drain region such that the gated semiconductor device is operable as a gated diode.

12. The method as claimed in claim 10, wherein the gated semiconductor device is operable as an insulated gate field effect transistor (FET), wherein the first gate is operable to apply a bias to adjust a threshold voltage of the FET.

13. The method as claimed in claim 1, wherein the step of forming the first gate includes forming a first gate polysilicon layer.

14. The method as claimed in claim 13, further comprising forming a first silicide region overlying the first gate polysilicon layer and a second silicide region overlying on the second gate.

15. The method as claimed in claim 14, further comprising forming a first conductive via contacting the first silicide region and a second conductive via contacting the second silicide region.

16. A method of making an integrated circuit including the method of making a gated semiconductor device as claimed in claim 1.

* * * * *